(12) United States Patent
Brachet et al.

(10) Patent No.: US 11,170,905 B2
(45) Date of Patent: Nov. 9, 2021

(54) NUCLEAR FUEL CLADDINGS, PRODUCTION METHOD THEREOF AND USES OF SAME AGAINST OXIDATION/HYDRIDING

(71) Applicant: COMMISSARIAT A L'ENERGIE ATOMIQUE ET AUX ENERGIES ALTERNATIVES, Paris (FR)

(72) Inventors: Jean-Christophe Brachet, Villebon-sur-Yvette (FR); Alain Billard, Exincourt (FR); Fédéric Schuster, St Germain-en-Laye (FR); Marion Le Flem, Fontenay Aux Roses (FR); Isabel Idarraga-Trujillo, Manosque (FR); Matthieu Le Saux, Massy (FR); Fernando Lomello, Gif-sur-Yvette (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 274 days.

(21) Appl. No.: 15/462,176

(22) Filed: Mar. 17, 2017

(65) Prior Publication Data

US 2017/0287578 A1 Oct. 5, 2017

Related U.S. Application Data

(63) Continuation-in-part of application No. PCT/FR2015/052475, filed on Sep. 16, 2015, and a
(Continued)

(51) Int. Cl.
*G21C 21/02* (2006.01)
*G21C 3/07* (2006.01)
(Continued)

(52) U.S. Cl.
CPC ............ *G21C 21/02* (2013.01); *C23C 14/021* (2013.01); *C23C 14/35* (2013.01); *C23C 14/354* (2013.01);
(Continued)

(58) Field of Classification Search
CPC ... G21C 3/06; G21C 3/07; G21C 3/20; G21C 21/02; C23C 14/021; C23C 14/022;
(Continued)

(56) References Cited

U.S. PATENT DOCUMENTS 4,022,662 A * 5/1977 Gordon .................... G21C 3/06
376/416
4,268,586 A * 5/1981 Hanneman .............. C23C 30/00
428/661
(Continued)

FOREIGN PATENT DOCUMENTS

EP 0 240 110 A1 10/1987
EP 0240110 A1 * 10/1987 ............. C23C 14/48
(Continued)

OTHER PUBLICATIONS

Ferrec, A., et al. "Correlation between mass-spectrometer measurements and thin film characteristics using dcMS and HiPIMS discharges" Surface & Coatings Technology 2010, vol. 250, pp. 52-56. (Year: 2014).*
(Continued)

*Primary Examiner* — Sharon M Davis
(74) *Attorney, Agent, or Firm* — Browdy and Neimark, PLLC

(57) ABSTRACT

The invention relates to a nuclear fuel cladding comprising: i) a substrate containing a zirconium-based inner layer, optionally coated with at least one intermediate layer formed by at least one intermediate material selected from among tantalum, molybdenum, tungsten, niobium, vanadium, haf-
(Continued)

nium or the alloys thereof; and ii) at least one protective outer layer placed on the substrate and formed by a protective material selected from either chromium or an alloy of chromium. The nuclear fuel cladding produced using the method of the invention has improved resistance to oxidation/hydriding. The invention also relates to the method for the production of the nuclear fuel cladding by ion etching of the surface of the substrate and deposition of the outer layer on the substrate with a high power impulse magnetron sputtering method (HiPIMS), as well as to the use thereof to protect against oxidation and/or hydriding.

8 Claims, 10 Drawing Sheets

Related U.S. Application Data continuation-in-part of application No. PCT/FR2015/052476, filed on Sep. 16, 2015.

(60) Provisional application No. 62/051,913, filed on Sep. 17, 2014.

(51) Int. Cl.
  *C23C 14/35* (2006.01)
  *C23C 28/02* (2006.01)
  *C23C 14/02* (2006.01)
  *G21C 3/20* (2006.01)

(52) U.S. Cl.
  CPC .......... *C23C 28/021* (2013.01); *C23C 28/023* (2013.01); *G21C 3/07* (2013.01); *G21C 3/20* (2013.01); *Y02E 30/30* (2013.01)

(58) Field of Classification Search
  CPC ......... C23C 14/14; C23C 14/16; C23C 14/35; C23C 14/352
  See application file for complete search history.

(56) References Cited

U.S. PATENT DOCUMENTS

| | | | | |
|---|---|---|---|---|
| 4,336,118 | A * | 6/1982 | Patten | C23C 14/00 |
| | | | | 204/192.12 |
| 4,494,987 | A | 1/1985 | Korenko | |
| 5,267,290 | A | 11/1993 | Corsetti et al. | |
| 5,373,541 | A | 12/1994 | Mardon et al. | |
| 8,187,720 | B2 | 5/2012 | Choi et al. | |
| 2009/0169910 | A1 | 7/2009 | Myrtveit | |
| 2010/0040189 | A1 | 2/2010 | Brachet et al. | |
| 2010/0091934 | A1* | 4/2010 | Kim | G21C 3/07 |
| | | | | 376/416 |
| 2011/0180389 | A1* | 7/2011 | Cremer | C23C 14/14 |
| | | | | 204/192.12 |
| 2013/0209834 | A1 | 8/2013 | Engelhart et al. | |
| 2013/0302639 | A1* | 11/2013 | Song | B32B 15/01 |
| | | | | 428/641 |
| 2013/0344348 | A1* | 12/2013 | Koo | B23K 26/32 |
| | | | | 428/553 |
| 2014/0234616 | A1* | 8/2014 | Hultman | C23C 14/0641 |
| | | | | 428/336 |
| 2014/0254740 | A1* | 9/2014 | Ledford | G21C 3/07 |
| | | | | 376/417 |
| 2014/0323367 | A1 | 10/2014 | Mordente et al. | |
| 2015/0050521 | A1* | 2/2015 | Flem | B32B 15/01 |
| | | | | 428/662 |

FOREIGN PATENT DOCUMENTS

| | | | |
|---|---|---|---|
| EP | 0624882 | A1 | 11/1994 |
| FR | 1493040 | A | 7/1967 |
| FR | 2789404 | A1 | 8/2000 |
| FR | 2 849 620 | A1 | 7/2004 |
| FR | 2989923 | A1 | 11/2013 |
| FR | 2992331 | A1 | 12/2013 |
| GB | 1203700 | | 9/1970 |
| JP | 02-263943 | | 10/1990 |
| JP | 5-171418 | A | 7/1993 |
| WO | 2008046999 | A1 | 4/2008 |
| WO | 2013/045454 | | 4/2013 |
| WO | 20130160587 | A1 | 10/2013 |
| WO | 2016042261 | A1 | 3/2016 |

OTHER PUBLICATIONS

Ehiasarian, A. "High-power impulse magnetron sputtering and its applications" Pure Appl. Chem. 2010, vol. 82 No. 6, pp. 1447-1258. (Year: 2010).*

Ferreira, F. et al. "Effect of peak target power on the properties of Cr thin filsm sputtered by HiPIMS in deep oscillation magnetron sputtering (DOMS) mode" Surface & Coatings Technology 2014, vol. 258, pp. 249-256. (Year: 2014).*

Kim et al., "Performance of a diffusion barrier under a fuel-clad chemical interaction (FCCI)" Journal of Nuclear Materials, 394:144-150(2009).

Chemelle et al., "Morphology and Composition of Second Phase Particles in Zircal0y-2" Journal of Nuclear Materials, 113:58-64 (1983).

Taylor et al., "A Simple Kinetic Model of Zircaloy Zr(Fe,Cr)2 Precipitate Amorphization During Neutron Irradiation" Lockheed Martin Corporation, Knolls Atomic Power Laboratory (KAPL), Document No. KAPL-P-000319(K99115), Jul. 1999.

Ati Wah Chang.,"Reactor Grade Zirconium Alloys for Nuclear Waste Disposal", Zirconium Alloys, pp. 1-4 (Nov. 21, 2003) downloaded on Dec. 16, 2015, from: https:j/www.atimetals.com/businessesjatispecialtyalloysandcomponentsjproducts/Documents/Zr nuke waste disposal.pdf.

Igbal et al., "Synthesis and characterization of bulk amorphous Zr65Cu18Ni9Al8 and [Zr0.65Cu0.18Ni0.09Al0.08]98Er2 Alloys" Journal of Non-Crystalline Solids 352:3290-3294 (2006).

Davidson et al., "The Effects on Fracture Toughness of Ductile-Phase Composition and Morphology in Nb—Cr—Ti and Nb—Si In Situ Composites" Metallurgical and Materials Transactions A, vol. 27A, pp. 3007-3018, Oct. 1996.

Database WPI, Week Jan. 2011, Jan. 1, 2011, Thomson Scientific. London. GB; AN 2010-N85039 XP002690390, —& KR 2010 0114392 A (Korea Atomic Energy Res Inst) (Oct. 25, 2010).

Database CA {Online] Chemical Abstracts Service, Columbus, Ohio, US; May 12, 1984 (May 12, 1984), Bykov, V. N. et al: "Effect of erbium on the oxidation resistance of z1rconium" XP002432538 Database accession No. 1981:501621, abrege & Zashchita Metallov , 17(2), 219-21 CODEN: ZAMfA9; ISSN: 0044-1856, 1981.

International Search Report for PCT/FR2015052475, dated Feb. 1, 2016.

International Search Report for PCT/FR2015052476, dated Jan. 18, 2016.

International Search Report for PCT/FR2013/050849, dated Jul. 18, 2013.

International Search Report for PCT/FR2007/001698, dated Mar. 20, 2007.

Brachet, et al., Behavior of Cr-Coated M5 Claddings During and After High Temperature Steam Oxidation From 800° C. up to 1500° C. (Loss-of-Coolant Accident & Design Extension Conditions), pp. 1-10, Conference Paper, Topfuel 2018 (Prague, Czech Republic, Oct. 2018).

Ferrec, Axel, Dépôt et Caractérisation de Métaux et de Nitrures à Base de Chrome par Pulvérisation Magnétron Pulsée (HiPIMS)[ Deposition and Characterization of Metals and Nitrides Based on Chromium by Pulsed Magnetron Spray (HIPIMS)]pp. 1-265 (Doctoral Thesis, University of Nantes, Science of Materials, Dec. 6, 2013).

French search report for FR1458933, dated Aug. 31, 2015, pp. 1-8.

\* cited by examiner

Distance from the Zircaloy-4/external Cr layer interface (μm)

NUCLEAR FUEL CLADDINGS, PRODUCTION METHOD THEREOF AND USES OF SAME AGAINST OXIDATION/HYDRIDING

CROSS-REFERENCE TO RELATED APPLICATIONS

The present application is a CIP of international applications number PCT/FR2015/052475, filed Sep. 16, 2015, and PCT/FR2015/052476, filed Sep. 16, 2015, both of which claim benefit to U.S. provisional application, 62/051,913, filed Sep. 17, 2014, the entire contents of all three of which are hereby incorporated herein by reference.

DESCRIPTION

Technical Field

The present invention belongs to the field of the materials employed in the nuclear field, in particular materials intended to exhibit the best possible resistance to the physicochemical conditions encountered under nominal conditions and during an accident scenario of a nuclear reactor, such as, for example a Pressurized Water Reactor (PWR) or a Boiling Water Reactor (BWR), or a reactor of "Canadian Deuterium Uranium" (CANDU) type.

The invention relates more particularly to nuclear fuel claddings, to their processes of manufacture and uses against oxidation and/or hydriding.

Technical Background

The constituent zirconium alloy of nuclear fuel claddings oxidizes on contact with the water constituting the coolant of PWR or BWR or of CANDU type nuclear reactors.

As the oxide formed is brittle and the take-up of hydrogen associated with the oxidation results in the precipitation of zirconium hydrides which cause embrittlement, the lifetime of the claddings is in large part limited by the maximum thickness of oxide acceptable and the content of associated absorbed hydrogen. In order to guarantee satisfactory residual mechanical properties of the cladding targeted at ensuring an optimum confinement of the nuclear fuel, the residual thickness of healthy and ductile zirconium alloy has to be sufficient and the fraction of hydrides sufficiently limited.

The possibility of limiting or of delaying such an oxidation and/or the hydriding may thus prove to be crucial in accident conditions.

These conditions are, for example, reached in the case of hypothetical accident scenarios of the RIA ("Reactivity Insertion Accident") or LOCA (Loss Of Coolant Accident) type, indeed even in conditions of dewatering of the spent fuel storage pool. They are characterized, among others, by high temperatures which are generally greater than 700° C., in particular between 800° C. and 1200° C., and which may be reached with a high rate of rise in temperature. At such temperatures, the coolant is in the form of steam.

The oxidation in accident conditions is much more critical than in conditions of normal operation of the nuclear reactor, as the deterioration in the cladding, the first barrier for confinement of the fuel, is faster and the associated risks greater. These risks are, among others, as follows:

emission of hydrogen;

embrittlement of the cladding at high temperature, by the oxidation, indeed even, under certain conditions, the hydriding of the cladding;

the embrittlement of the cladding on quenching, brought about by the sudden decrease in temperature during the massive supplying of water for making the core of the nuclear reactor safe;

low mechanical strength of the cladding after the quenching or the cooling, in the case, among others, of post accident handling operations, of earthquake aftershocks.

In view of these risks, it is essential to limit as far as possible the high temperature oxidation and/or hydriding of the cladding in order to improve the safety of nuclear reactors using, among others, water as coolant.

The solution proposed by the patent application "WO 2013/160587" consists in producing a nuclear fuel cladding in which the zirconium-based substrate is covered with a multilayer coating comprising metal layers composed of chromium, of a chromium alloy and/or of a ternary alloy of the Nb—Cr—Ti system.

Nevertheless, additional experiments have shown that the resistance to high-temperature oxidation, although improved with respect to the prior claddings, proves to be insufficient at very high temperature, typically for temperatures of greater than or equal to 1200° C. when the deposition of the multilayer coating on the zirconium-based substrate was carried out by a process of physical vapor deposition (PVD) by magnetron cathode sputtering of conventional type.

These very high temperatures lie at the extreme of, indeed even beyond, those of the high temperatures between 700° C. and 1200° C. which are set by accident regulatory conditions.

In point of fact, the regulatory criteria governing the dimensioning accidents according to the scenario of "LOCA" type defined from the 1970s require that the maximum temperature of the cladding does not exceed 1204° C. (2200° F.) and a maximum degree of "ECR" oxidation of 17%.

The degree of "ECR" ("Equivalent Cladding Reacted") oxidation is the percentage of thickness of metal cladding converted into zirconia ($ZrO_2$) resulting from the oxidation of the zirconium contained in the nuclear fuel cladding, it being assumed that all the oxygen which has reacted forms stoichiometric zirconia.

In order to take into account the additional embrittling effect related to the in service hydriding of the cladding, this acceptable residual degree of "ECR" oxidation may henceforth be much lower than 17% under certain conditions, such as, for example, a cladding hydrided in service up to several hundred ppm by weight, which corresponds in practice to a duration of oxidation of the cladding which should not exceed a few minutes at 1200° C.

An improvement in the resistance to oxidation and/or hydriding at very high temperature would advantageously make it possible to obtain additional margins of safety, among others by preventing or delaying all the more the deterioration in the cladding in the event of aggravation or of persistence of the accident situation.

DESCRIPTION OF THE INVENTION

One of the aims of the invention is thus to prevent or to alleviate one or more of the disadvantages described above by providing a nuclear fuel cladding and a process for the manufacture thereof which makes it possible to improve the resistance to oxidation and/or hydriding, among others in the presence of steam.

Another aim of the invention is to improve this resistance to oxidation and/or hydriding at very high temperature, namely above 1200° C., particularly between 1200° C. and 1400° C., more particularly between 1200° C. and 1300° C.; among others when these temperatures are reached with a rate of rise in temperature which is between 0.1° C./second and 300° C./second.

Another aim of the invention is to improve the duration of the resistance to oxidation and/or hydriding, beyond which duration the confinement of the nuclear fuel is no longer certain.

The present invention thus relates to a process for the manufacture of a nuclear fuel cladding comprising i) a substrate containing a zirconium-based internal layer coated or not coated with at least one interposed layer placed over the internal layer and ii) at least one external layer placed over the substrate and composed of a protective material chosen from chromium or a chromium alloy; the process comprising the following successive steps:

a) ion etching of the surface of the substrate;
b) deposition of the at least one external layer over the substrate with a high power impulse magnetron sputtering (HiPIMS) process in which the magnetron cathode is composed of the protective material.

The nuclear fuel cladding thus manufactured can be composite (presence of an interposed layer) or not.

In comparison with the processes of the state of the art, the manufacturing process of the invention has among others the distinctive feature that it uses a high power impulse magnetron sputtering (HiPIMS) process in order to deposit, according to step b), the at least one chromium-based external layer over the zirconium-based internal layer. Such a process is known to a person skilled in the art and described, for example, in the document "*Techniques de l'ingénieur, La pulvérisation cathodique magnétron en régime d'impulsions de haute puissance (HiPIMS) pulvérisation cathodique magnétron, Référence IN207*" [Techniques of the Engineer, Magnetron cathode sputtering under high power impulse conditions (HiPIMS) magnetron sputtering, Reference IN207].

The HiPIMS sputtering process differs in a number of aspects from conventional magnetron cathode sputtering processes.

In accordance with the conventional magnetron cathode sputtering process as used in "WO 2013/160587" (mentioned hereinbelow as conventional magnetron PVD process), a difference in potential is applied between a negatively polarized chromium target (magnetron cathode) and the walls of the cathode sputtering reactor which are connected to earth.

For this type of process, the continuous polarization voltage applied to the target is typically between −600 V and −200 V. The discharge current is a few amperes.

Under these conditions, the rarefied atmosphere, generally composed of argon, is then partially ionized and forms a cold plasma. It then essentially comprises argon atoms Ar and a low proportion of argon ions $Ar^+$, but no metal ions or metal ions in an infinitesimal amount far below $10^{-6}$. The $Ar^+$ ions are subsequently accelerated by the electric field of the target, which they impact, which results in the ejection of chromium atoms which are deposited on the substrate to be coated which generally faces the target.

The HiPIMS sputtering process differs in particular from the conventional magnetron PVD process used in "WO 2013/160587" in several characteristics, among others:

high frequency polarization impulses are applied to the chromium target constituting the magnetron cathode. The impulses last, for example, from 1/1000 to 1/100 of the total polarization duration;

the instantaneous power delivered by each impulse is from several tens of kilowatts to a few megawatts. This results in the ejection of a large amount of $Cr^+$ metal ions, although the power averaged over the entire duration of polarization is at most a few kilowatts, for example less than 1.2 kW;

the production of an atmosphere essentially composed of $Cr^-$ metal ions.

Unexpectedly, the inventors have discovered that a nuclear fuel cladding obtained by the manufacturing process of the invention made it possible to confer on it an improved resistance to oxidation and/or hydriding, in particular at very high temperature, among others in the presence of steam.

Such properties cannot be anticipated from the viewpoint of the specific chemical and metallurgical qualities of zirconium and the zirconium alloys used for nuclear applications, among others their chemical composition, surface condition, crystal texture, final metallurgical state (work-hardened or more or less recrystallized), which properties are liable to influence the quality and the behavior of the coatings.

In particular, the α phase of a zirconium alloy (denoted "Zr-α", of compact hexagonal crystallographic structure) at low temperature is converted into the β phase (denoted "β-Zr", of cubic centered crystallographic structure) in a temperature range typically ranging from 700° C. to 1000° C. On changing from the Zr-α structure to the β-Zr cubic structure, the alloy undergoes local dimensional variations. These variations are a priori unfavorable to the mechanical strength of an external layer which would cover a zirconium-based internal layer, due among others to the incompatibility in their coefficients of expansion. These difficulties of adhesion are accentuated by the mechanisms of diffusion of chemical entities, which are faster in the β-Zr phase than in the Zr-α phase, and which may modify the interface between the substrate and its coating.

The invention also relates to a nuclear fuel cladding (composite or not) obtained or obtainable by the manufacturing process of the invention.

The invention also relates to a composite nuclear fuel cladding comprising i) a substrate containing a zirconium-based internal layer and at least one interposed layer placed over the internal layer and composed of at least one interposed material chosen from tantalum, molybdenum, tungsten, niobium, vanadium, hafnium or their alloys and ii) at least one external layer placed over the substrate and composed of a protective material chosen from chromium or a chromium alloy.

In this case, the interposed material or the protective material may be respectively deposited on the internal layer or on the substrate by any type of process, for example a process of physical vapor deposition by magnetron cathode sputtering different from the HiPIMS sputtering process, or by a high power impulse magnetron sputtering (HiPIMS) such as described, among others in its alternative forms, in the present description wherein the magnetron cathode is composed of the interposed material or of the protective material.

The internal layer of the composite nuclear fuel cladding can be composed of a zirconium alloy comprising, by weight, from 100 ppm to 3000 ppm of iron, the cladding comprising an interface layer positioned between the internal layer and the external layer and composed of an interfacial material comprising at least one intermetallic compound chosen from $ZrCr_2$ of cubic crystal structure, $Zr(Fe, Cr)_2$ of hexagonal crystal structure or $ZrFe_2$ of cubic crystal structure. Naturally, it is in particular positioned between the internal layer and the first external layer.

The interface layer is formed during the HiPIMS deposition according to step b) of the external layer on the substrate in the absence of at least one interposed layer placed over the internal layer and when the constituent zirconium alloy of the internal layer comprises, by weight, from 100 ppm to 3000 ppm of iron.

Unexpectedly, it does not damage the adhesion of the external layer with regard to the substrate, whereas intermetallic compounds are known for their mechanical properties of brittle type.

Furthermore, under oxidation in the presence of steam, at high temperature, indeed even very high temperature (for example at 1200° C.), the inventors have found that the interfacial layer predominantly or completely comprising at least one intermetallic compound thickens. Here again, unexpectedly, no generalized exfoliation is found, despite the assumed intrinsic brittleness of an intermetallic compound and the interfacial stresses which theoretically may develop during the manufacturing steps, indeed even subsequently in service and/or in nominal conditions or certain accident conditions. See, for example, example 2.4

Preferably, the interface layer has a mean thickness of 10 nm to 1 µm.

These types of nuclear fuel claddings according to the invention, namely obtained or liable to be obtained by the manufacturing process of the invention, composite or non-composite or with an interface layer, may be provided according to one or more of the alternative forms described in the present description for the abovementioned manufacturing process of the invention, among others the alternative forms relating to the structure and/or to the composition of a nuclear fuel cladding.

These alternative forms relate among others and not exclusively to: the internal layer, the internal coating, the composition of the zirconium alloy or of the chromium alloy, the structure of the external layer, such as are described in detail in the present description, among others the description of the manufacturing process of the invention.

The geometry of these claddings is such that they may be provided in the form of a tube, or of a plate resulting more particularly from the assembling of two subunits.

The invention also relates to a process for the manufacture of a composite nuclear fuel cladding, comprising the following successive steps:

A) production of a substrate by deposition, on a zirconium-based internal layer, of at least one interposed layer composed of at least one interposed material chosen from tantalum, molybdenum, tungsten, niobium, vanadium, hafnium or their alloys;

B) deposition, on the substrate, of at least one external layer composed of a protective material chosen from chromium or a chromium alloy.

The deposition according to step A) and/or B) can be carried out by a physical vapor deposition or a pulsed electrolysis.

The physical vapor deposition may be a cathode sputtering, more particularly of magnetron type, still more particularly an HiPIMS sputtering process preferably according to one or more of the characteristics shown in the present description.

When the interposed layer is composed of hafnium, its thickness is from 1 nm to 1 µm.

The invention also relates to the use of these types of claddings, for combating oxidation and/or hydriding in a humid atmosphere comprising water, in particular in the form of steam.

The invention also relates to the use of these types of claddings (in particular the composite nuclear fuel cladding), for combating hydriding in a hydrogenated atmosphere comprising hydrogen, in particular an atmosphere comprising more than 50 mole % of hydrogen and/or water, in particular in the form of steam.

The humid atmosphere or the hydrogenated atmosphere may further comprise an additional gas chosen from air, nitrogen, carbon dioxide or their mixtures.

Preferably, the purpose of these uses is to combat oxidation and/or hydriding:
in which the humid atmosphere or the hydrogenated atmosphere is at a temperature of between 25° C. and 1400° C., indeed even between 25° C. and 1600° C., more particularly a temperature of between 200° C. and 1300° C., still more particularly between 1200° C. and 1300° C., indeed even between 1300° C. and 1600° C.; and/or
up to at least 5000 seconds, more particularly between 1000 seconds and 5000 seconds, in particular when the temperature is between 1200° C. and 1300° C.; and/or
in the presence of a rate of rise in temperature which is between 0.1° C./second and 300° C./second; and/or
subsequent to a quenching with water of the nuclear fuel cladding, in particular in which the quenching takes place at a temperature of between 25° C. and 400° C.

DETAILED DESCRIPTION OF THE INVENTION

In the present description of the invention, a verb such as "to comprise", "to incorporate", "to include", "to contain", "composed of" and its conjugated forms are open terms and thus do not exclude the presence of additional element(s) and/or step(s) which are added to the initial element(s) and/or step(s) stated after these terms. However, these open terms are targeted in addition at a specific embodiment in which only the initial element(s) and/or step(s), with the exclusion of any other, are targeted; in which case, the open term is targeted in addition at the closed term "to consist of", "to constitute" and its conjugated forms.

The expression "and/or" is targeted at connecting elements for the purpose of simultaneously denoting just one of these elements, both elements, indeed even their mixture or their combination.

The use of the indefinite article "one" or "a" for an element or a step does not exclude, unless otherwise mentioned, the presence of a plurality of elements or steps.

Any reference sign in brackets in the claims should not be interpreted as limiting the scope of the invention.

Furthermore, unless otherwise indicated, the values of the limits are included in the ranges of parameters shown and the temperatures shown are considered for an implementation at atmospheric pressure.

The manufacturing processes of the invention are targeted at producing a nuclear fuel cladding (composite or not) comprising:

i) a substrate containing a zirconium-based internal layer intended to be in contact with or facing the nuclear fuel, the internal layer being coated or not with at least one interposed layer; and ii) at least one chromium-based external layer placed over the substrate and intended to protect the cladding with regard to the exterior environment, in particular the coolant.

As previously mentioned, the alternative embodiments described hereinafter, among others the alternative forms relating to the structure and/or to the composition of a nuclear fuel cladding are also alternative forms for all the types of nuclear fuel claddings of the present description.

Preferably, at least one interposed layer is placed between the internal layer and the external layer with regard to which layers it acts as diffusion barrier. In this embodiment, the substrate is formed by the combination of the internal layer and of the at least one interposed layer.

The cladding may also comprise an internal coating placed under the internal layer, the thickness of which is, for example, between 50 µm and 150 µm. The internal coating may comprise one or more layers. It constitutes an internal "liner" which improves the strength of the cladding with regard to the physicochemical and mechanical interactions with the fuel. It is generally obtained by hot coextrusion during the manufacture of the internal layer.

The internal layer is zirconium-based, namely that it is composed of zirconium to more than 50% by weight, particularly more than 90%, indeed even more than 95%.

More specifically, the internal layer and/or the internal coating is composed of zirconium or of a zirconium alloy. The zirconium alloy may comprise, by weight:
from 0% to 3% of niobium; preferably 0% to 1.2%;
from 0% to 2% of tin; preferably 0% to 1.3%;
from 0% to 0.5% of iron; preferably from 100 ppm to 2000 pm;
from 0% to 0.2% of chromium;
from 0% to 0.2% of nickel;
from 0% to 0.2% of copper;
from 0% to 1% of vanadium;
from 0% to 1% of molybdenum; and
from 0.05% to 0.2% of oxygen.

The zirconium alloy is, for example, Zircaloy-2 or Zircaloy-4.

The zirconium alloy may in particular be chosen from an alloy meeting the constraints of the nuclear field, for example Zircaloy-2, Zircaloy-4, Zirlo™, Optimized-Zirlo™ or M5™. The compositions of these alloys are such that they comprise, by weight, for example:
Zircaloy-2 alloy: 1.20% to 1.70% of Sn; 0.07% to 0.20% of Fe; 0.05% to 1.15% of Cr; 0.03% to 0.08% of Ni; 900 ppm to 1500 ppm of O; the remainder is zirconium.
Zircaloy-4 alloy: 1.20% to 1.70% of Sn; 0.18% to 0.24% of Fe; 0.07% to 1.13% of Cr; 900 ppm to 1500 ppm of O; less than 0.007% of Ni; the remainder is zirconium.
Zirlo™ alloy: 0.5% to 2.0% of Nb; 0.7% to 1.5% of Sn; 0.07% to 0.28% of at least one element chosen from Fe, Ni, Cr; up to 200 ppm of C; the remainder is zirconium.
Optimized-Zirlo™ alloy: 0.8% to 1.2% of Nb; 0.6% to 0.9% of Sn; 0.090% to 0.13% of Fe; 0.105% to 0.145% of O; the remainder is zirconium.
M5™ alloy: 0.8% to 1.2% of Nb; 0.090% to 0.149% of O; 200 ppm to 1000 ppm of Fe; the remainder is zirconium.

The at least one external layer placed over the substrate is composed of a protective material chosen from chromium or a chromium alloy, in particular any chromium alloy capable of being used in the nuclear field and/or under irradiation.

More particularly, the chromium alloy composing the protective material may comprise at least one alloying element chosen from silicon, yttrium or aluminum, for example at a content of 0.1% to 20% by atoms.

The at least one external layer optionally has a columnar structure.

Preferably, the constituent columnar grains of the columnar structure have a mean diameter of 100 nm to 10 µm.

The at least one chromium-based external layer is deposited over the substrate with the manufacturing process of the invention according to the following successive steps:

a) ion etching of the surface of the substrate;
b) deposition over the substrate of the at least one external layer with a high power impulse magnetron sputtering (HiPIMS) process.

The magnetron cathode constituting the target is then composed of the protective material.

Steps a) and b) are carried out over the final layer of the substrate, namely over the zirconium-based internal layer or over the final interposed layer, according to whether the substrate respectively contains an internal layer coated or not coated with at least one interposed layer.

In order to place at least one interposed layer over the internal layer, it is possible to carry out the following successive steps carried out before the etching step a):

a') ion etching of the surface of the internal layer;
b') production of a substrate by deposition of the at least one interposed layer over the internal layer with a high power impulse magnetron sputtering (HiPIMS) process in which the magnetron cathode is composed of the at least one interposed material.

This embodiment constitutes a specific case of the process for the manufacture of the composite nuclear fuel cladding according to the invention in that the at least one interposed layer is deposited with an HiPIMS sputtering process.

The distance separating the substrate and the magnetron cathode used according to the etching step a) or a') and/or the deposition step b) or b') may be between 40 mm and 150 mm.

The ion etching according to step a) and/or a') may be carried out with an HiPIMS etching process or a cathodic arc etching process.

The use of the HiPIMS sputtering process according to step b) or b') requires the establishment of a polarization voltage using polarization impulses which are applied to the target present in the cathode sputtering reactor.

The magnetron cathode may be a flat cathode, or a hollow cathode for example a cylindrical cathode.

The ranges of values which follow relating to the polarization voltages and the polarization impulses are given by way of indication for a magnetron cathode with a surface area of 300 cm². A person skilled in the art may in particular adjust the values shown for the polarization impulses applied to the magnetron cathode in order to observe the recommended power density range, it being known that the polarization voltage to be applied varies inversely in proportion to the surface area of the target.

The HiPIMS etching process used in step a) and/or a') may comprise the polarization of the magnetron cathode with a voltage of between −1000 V and −500 V.

The cathodic arc etching process according to step a) and/or a') may comprise the polarization of an arc cathode with a voltage of between −20 V and −50 V or according to an intensity of 50 A to 250 A.

The HiPIMS or cathodic arc etching process according to step a) and/or a') may comprise the polarization of the substrate with a voltage of between −800 V and −600 V.

The Cr$^+$ ions produced during step a) and/or a') etch the surface of the substrate for the purpose of improving the adhesion of the external layer to be deposited.

The HiPIMS sputtering process according to step b) and/or b') generally comprises the maintenance of the polarization of the magnetron cathode or so that the voltage remains between −1000 V and −500 V.

The polarization of the substrate is for its part decreased with respect to the step of etching according to step a) and/or a'), for example so that the HiPIMS sputtering process according to step b) and/or b') comprises the polarization of the substrate with a voltage of between −200 V and 0 V.

The HiPIMS sputtering process according to step b) and/or b') may comprise the application to the magnetron cathode of polarization impulses, each of which may exhibit at least one of the following characteristics:
  duration of 10 ps to 200 ps;
  instantaneous mean peak intensity of 50 A to 1000 A, for example of 50 A to 200 A;
  instantaneous power of 50 kW to 2 MW, more particularly of 100 kW to 2 MW;
  power density of 0.2 kW/cm$^2$ to 5 kW/cm$^2$, more particularly 1 kW/cm$^2$ to 5 kW/cm$^2$.

The polarization impulses may be applied to the magnetron cathode according to a frequency of 50 Hz to 600 Hz, more particularly of 100 Hz to 600 Hz.

The HiPIMS etching process according to step a) and/or a') or the HiPIMS sputtering process according to step b) and/or b') is carried out with a carrier gas comprising at least one rare gas.

The rare gas may be chosen from argon, xenon or krypton.

The carrier gas is, for example, at a pressure of between 0.2 Pa and 2 Pa.

According to a specific embodiment of the manufacturing process of the invention, after the deposition over the substrate of the first external layer with the HiPIMS sputtering process according to step b) and/or b'), at least a part of the additional external layer(s) are deposited during step b) and/or b') with a magnetron cathode sputtering process of a different type from the HiPIMS which is carried out simultaneously with the HiPIMS sputtering process according to step b) and/or b').

The magnetron cathode sputtering process of a different type from the HiPIMS is, for example, such that the polarization of the target is continuous ("DC" for "Direct Current") or pulsed at a medium frequency ("pulsed DC"), resulting in a polarization voltage delivering an instantaneous power of a few kilowatts.

The deposition of the additional external layers with a conventional magnetron PVD process combined with the HiPIMS sputtering process according to step b) and/or b') makes it possible to improve the industrial operation of the manufacturing process of the invention by increasing the rate of deposition of the additional external layers.

On the conclusion of the manufacturing process of the invention, at least one external layer is obtained which has a thickness of 1 μm to 50 μm, preferably of 3 μm to 25 μm, still more preferably of 3 μm to 10 μm. The cumulative thickness of the external layers is generally from 1 μm to 50 μm, indeed even 2 μm to 50 μm.

Several external layers may be deposited on the substrate. For example, the nuclear fuel cladding comprises from 1 to 50 external layers, in order to constitute a multilayer external coating. If appropriate, the external layers may merge to give a single external layer in order to constitute a monolayer external coating, for example after application of a heat treatment to the external layers or by varying the etching and deposition conditions.

According to a preferred embodiment of the manufacturing process of the invention, the at least one interposed layer is composed of at least one interposed material chosen from tantalum, molybdenum, tungsten, niobium, vanadium, hafnium or their alloys.

Such an interposed layer constitutes a diffusion barrier which limits, indeed even prevents:
  the diffusion of the chromium from the external layer toward the zirconium-based internal layer, which results in an accelerated consumption of the external layer(s) in addition to its oxidation to give chromic oxide;
  the formation of a eutectic above 1330° C. approximately, which may potentially harm the mechanical strength of the fuel claddings and their ability to be cooled.

Preferably, the interposed material is tantalum.

Tantalum or its alloy can be replaced or combined with at least one refractory metal element or its alloy, the physicochemical properties of which are compatible with the zirconium-based internal layer up to 1300° C. In particular, up to 1300° C., the refractory metal element or its alloy does not form a eutectic and exhibits a limited diffusion into the zirconium and/or the chromium.

Apart from tantalum, such a refractory metal element is, for example, molybdenum, tungsten or niobium, vanadium, hafnium.

Other subject matters, characteristics and advantages of the invention will now be specified in the description which follows of specific embodiments of the process of the invention, given by way of nonlimiting illustration, with reference to the appended figures.

DESCRIPTION OF PARTICULAR EMBODIMENTS

Figure 1A:
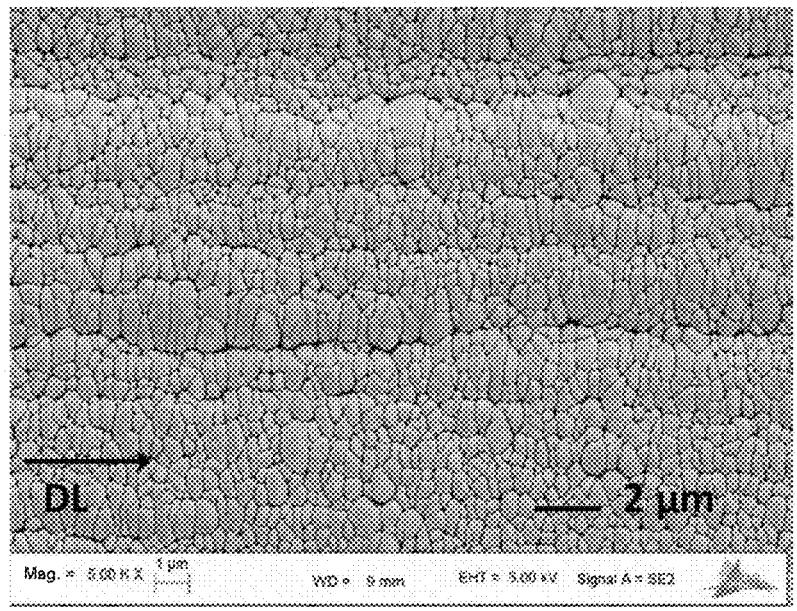
FIGS. 1A and 1B represent Scanning Electron Microscopy of Field Emission Gun type (SEM-FEG) photographs illustrating the surface condition of a Zircaloy-4 plate respectively provided with a chromium coating deposited with a conventional magnetron PVD process and with an external chromium layer deposited with an HiPIMS sputtering process according to the invention.

1. Manufacture of a Plate using the Process of the Invention

This example of implementation of the manufacturing process of the invention is carried out in a cathode sputtering reactor sold by Balzers (BAK 640 model) and equipped with a Hüttinger generator. The experimental conditions applied may nevertheless vary as a function of the reactor used or of its magnetic configuration, of the shape and of the size of the target, . . . .

In accordance with his general knowledge, a person skilled in the art may, however, easily adapt himself to these variations by modifying at least one of the parameters, such as, for example, the polarization voltage of the substrate which is applied during the step a) of ion etching or the step b) of deposition of the internal layer, the duration, the frequency, the intensity or the polarization voltage of the polarization impulses, the distance between the chromium target and the substrate, or the pressure of the carrier gas.

More particularly, these parameters influence the mean energy of the $Cr^+$ Pions which are produced during steps a) or b). This energy can condition the density, the homogeneity, the texture, the microstructure or the state of stress of the external layer.

1.1. Step of Ion Etching

A Zircaloy-4 plate with dimensions of 45 mm×14 mm×1.2 mm is degreased in an alkaline solution, rinsed with water and cleaned ultrasonically in ethanol.

It is subsequently placed in an HiPIMS cathode sputtering reactor containing a chromium magnetron cathode placed at a distance generally of between 6 cm and 8 cm and in this instance of 8 cm. The chamber of the reactor is placed under a vacuum of less than $2.10^{-5}$ mbar and then filled with a carrier gas composed of argon at a pressure of 0.5 Pa.

The plate constituting the internal layer and thus the substrate to be coated is polarized negatively with a polarization voltage of −800 V.

The chromium target is subsequently supplied using the HiPIMS generator according to a polarization voltage of −800 V in order to generate a strongly ionized discharge. The chromium is then sputtered in the form of ions which are accelerated by the electric field of the substrate. The adsorbed carbon-based entities and the nanometric layer of native zirconium oxide or hydroxide are then removed from the surface of the substrate in order to improve the adhesion of the external layer. This ion etching of the substrate lasts 3 minutes in order to limit the heating up of the plate.

1.2. Step of Deposition of the External Layer by HiPIMS Sputtering

The polarization voltage applied to the etched plate is, for example, decreased between −50 V and 0 V, in the present case to −50 V for 8 hours. As the rate of deposition is generally between 0.5 μm/h and 1 μm/h, these conditions lead to the deposition of an external chromium layer with a thickness of 6 μm.

The polarization voltage of the chromium target is maintained at −800 V. Several polarization impulses are applied to the magnetron cathode according to the following characteristics:

duration of an impulse=40 μs;
frequency of the impulses=500 Hz;
overall mean intensity=approximately 2 A;
instantaneous mean intensity=approximately 100 A;
overall mean power=approximately 1 kW; and
instantaneous mean power for an impulse=60 kW.

Figure 1B:
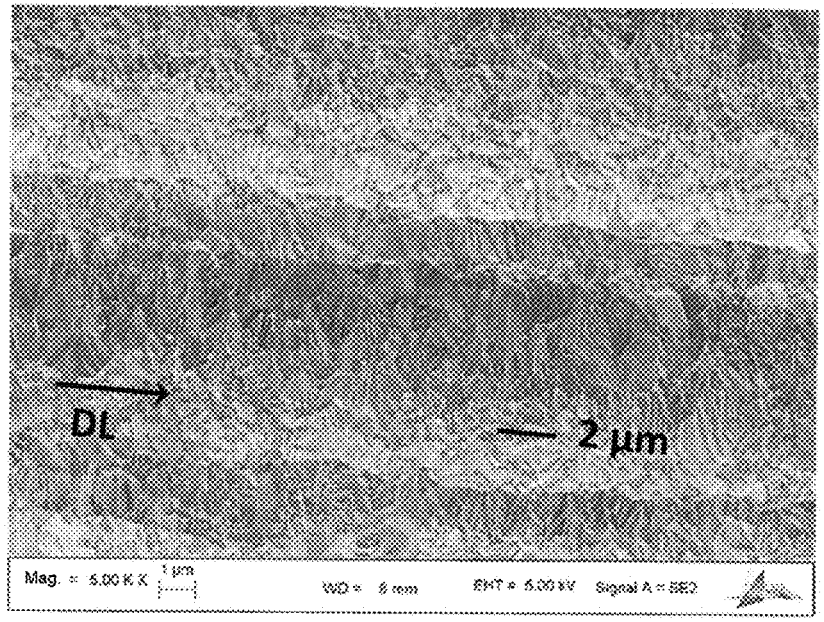

The surface condition of the plate coated with the external chromium layer is illustrated by FIG. 1B. By way of comparison, FIG. 1A illustrates a very different surface morphology obtained for a control Zircaloy-4 plate on which a chromium coating of the same thickness was deposited using a conventional magnetron PVD process similar to that described in example 1 of "WO2013/160587".

Figure 1C:
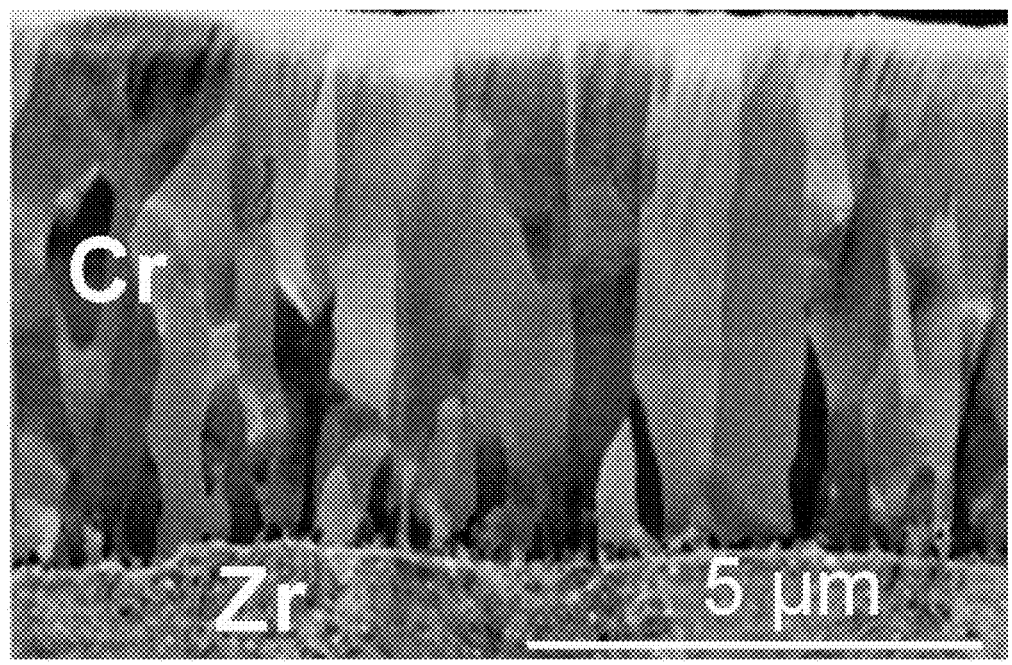
FIG. 1C represents the photograph obtained by scanning electron microscopy with a field emission gun of a section of the plate of FIG. 1B.

FIG. 1C illustrates the structure in columnar grains of the chromium-based external layer.

Figure 1D:
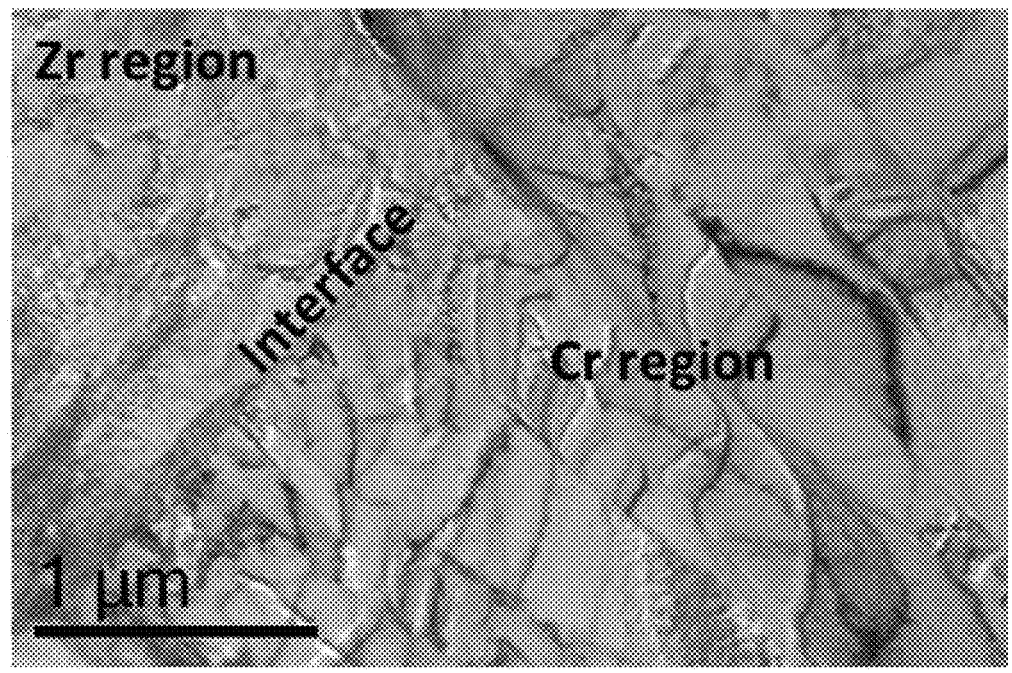
FIG. 1D represent the photographs obtained by Transmission Electron Microscopy (TEM) of the interface region between the substrate and the external layer of the plate of FIG. 1B.

FIG. 1D again illustrates the columnar structure of the external layer, and also the presence of an interface layer.

Figure 1E:
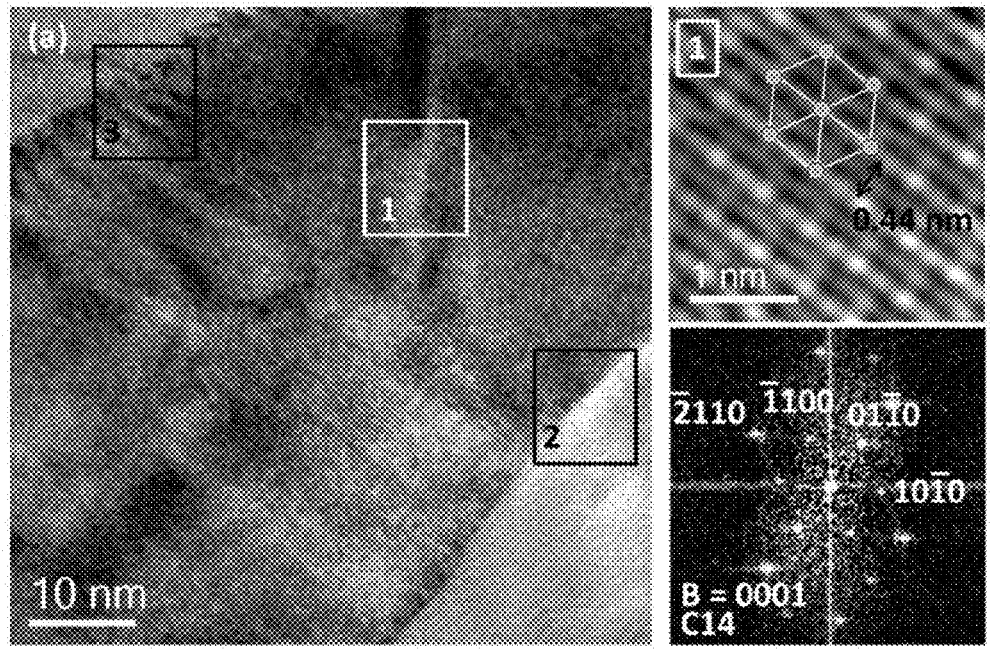
FIGS. 1E, 1F and 1G represent the photographs obtained by high resolution TEM and the associated electron diffraction photographs of the interface region.

FIG. 1E shows the zones 1, 2 and 3 of the interface region which are respectively positioned in the middle of the interface region, between the zirconium-based substrate and the interface region, and between the chromium-based external layer and the interface region. It also illustrates the zone 1 and the structural parameters which identify the intermetallic compound $Zr(Fe,Cr)_2$ of hexagonal crystal structure of which this zone is composed.

Figure 1F:
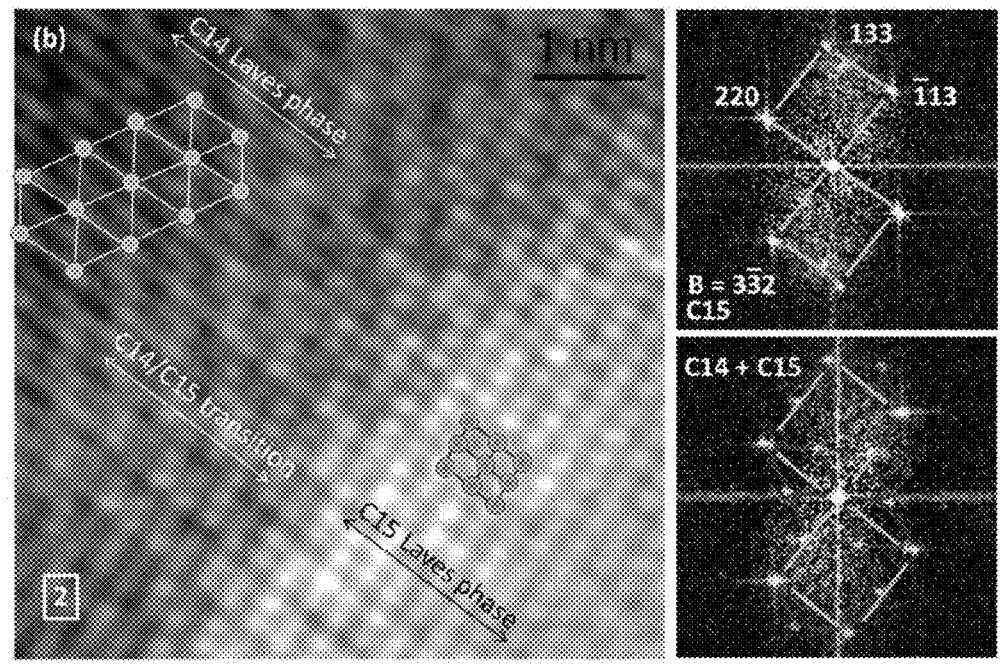

FIG. 1F illustrates the zone 2 and the structural parameters which identify the intermetallic compound ZrFe2 of cubic crystal structure of which this zone is composed.

Figure 1G:
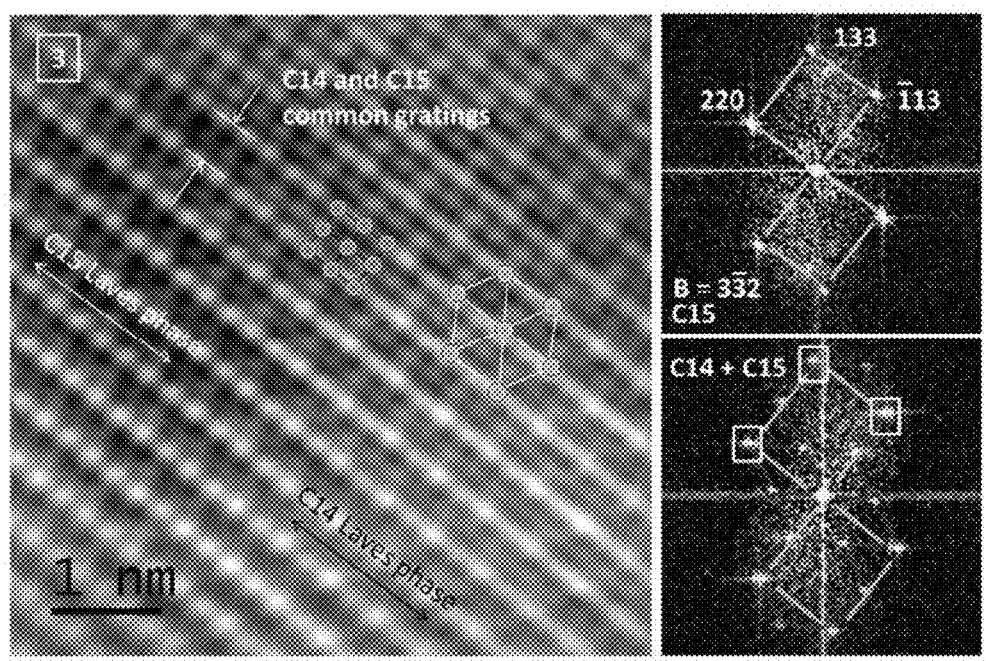

FIG. 1G illustrates the zone 3 and the structural parameters which identify the intermetallic compound ZrCr2 of cubic crystal structure of which this zone is composed.

The combined FIGS. 1E, 1F and 1G thus show that the composition of the interface layer gradually changes from the interface with the Zircaloy-4 substrate toward the interface with the external chromium layer according to the following order of the intermetallic compounds: ZrFe2, Zr(Fe,Cr)2 and ZrCr2. Contrary to all expectations, the iron-containing nanometric phases ZrFe2 and $Zr(Fe,Cr)_2$ were formed by interaction of the zirconium alloy of the substrate with the chromium.

2. Properties with Regard to the Oxidation/Hydriding 2.1. Evaluation of the Resistance to Oxidation in Accident Conditions at 1200° C.

In order to evaluate its resistance to oxidation, a plate based on Zircaloy-4 provided with a single external chromium layer of 6 μm in accordance with example 1 stays for 300 seconds in a furnace in which steam brought to 1200° C. circulates.

By way of comparison, the same experiment is carried out with a control Zircaloy-4 plate which has been covered with a chromium coating of the same thickness using a conventional cathode sputtering process in accordance with example 1 of "WO2013/160587".

Figure 2A:
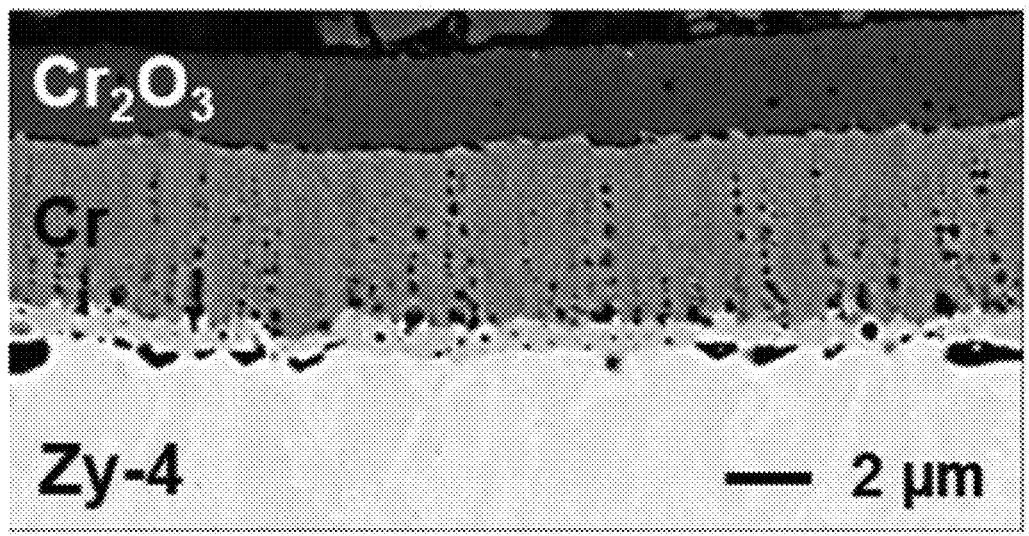
FIGS. 2A and 2B represent Scanning Electron Microscopy (SEM) photographs of a cross section produced in the thickness of the plates respectively illustrated in FIGS. 1A and 1B, after they have been subjected to an oxidation at 1200° C. for 300 s.
Figure 2B:
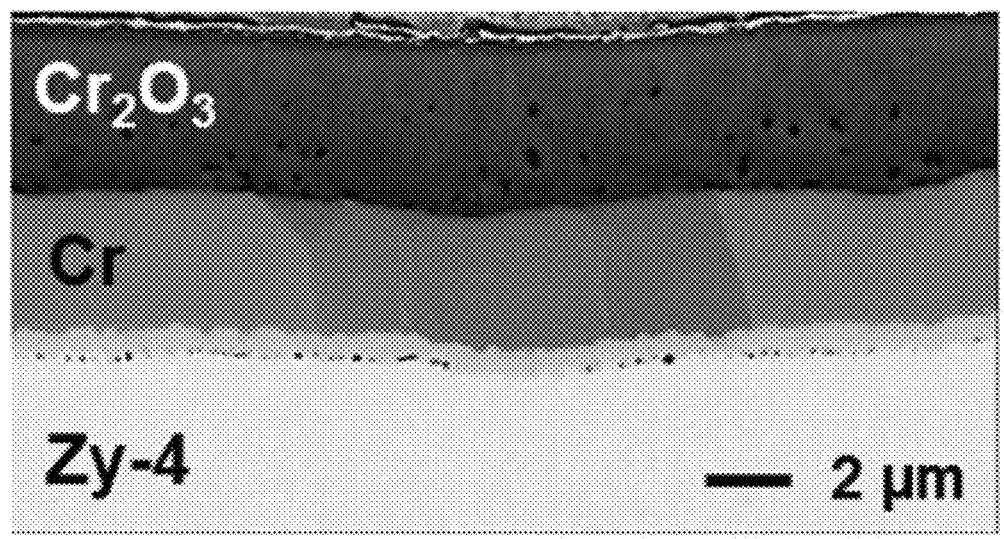

The condition of the plates obtained on completion of this oxidation is illustrated by FIGS. 2A and 2B.

FIG. 2A shows that a layer of chromium oxide $Cr_2O_3$ of limited thickness is formed. The chromium coating deposited according to the process of the state of the art thus has a partially protective nature with regard to the oxidation at 1200° C. Nevertheless, porosities and cracks are present in the residual metallic chromium layer lying under the layer of chromium oxide $Cr_2O_3$. They result among others from an exfoliation at the interface between the Zircaloy-4 substrate and the chromium coating, which reflects an embrittling of the residual metallic chromium layer of the control plate and a deterioration in its properties of resistance to oxidation, among others by loss of leaktightness with regard to the diffusion of oxygen.

On the other hand, even if FIG. 2B illustrates the formation of a peripheral layer of chromium oxide $Cr_2O_3$ of greater thickness, the underlying layer of residual metallic chromium initially deposited with the HiPIMS sputtering process is for its part not damaged. This is confirmed by the absence of exfoliation at the interface with the internal Zircaloy-4 layer, and also by a very low amount of porosities. This preserved microstructure confirms the protective nature of the chromium coating with regard to the oxidation/hydriding of the zirconium alloy up to at least 1200° C., in particular its ability to limit the diffusion of the oxygen into the internal Zircaloy-4 layer.

Figure 3A:
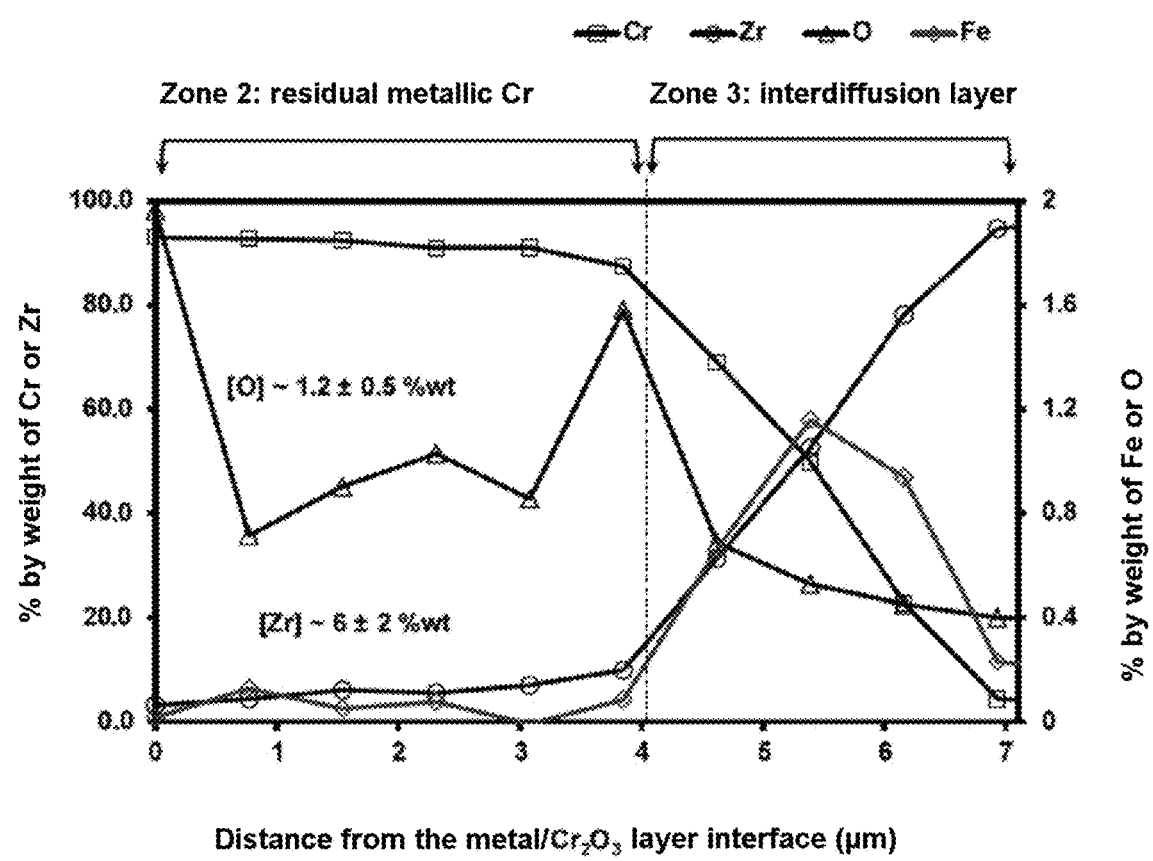
FIGS. 3A and 3B illustrate the corresponding concentrations by weight, measured with an electron microprobe, for the elements zirconium, chromium, iron and oxygen as a function of the distance in micrometers with respect to the metal interface. This interface is that separating the external chromium layer (or if appropriate the Zircaloy-4 substrate, if all the external chromium layer has been oxidized to give $Cr_2O_3$) from the external chromium oxide $Cr_2O_3$ layer.
Figure 3B:
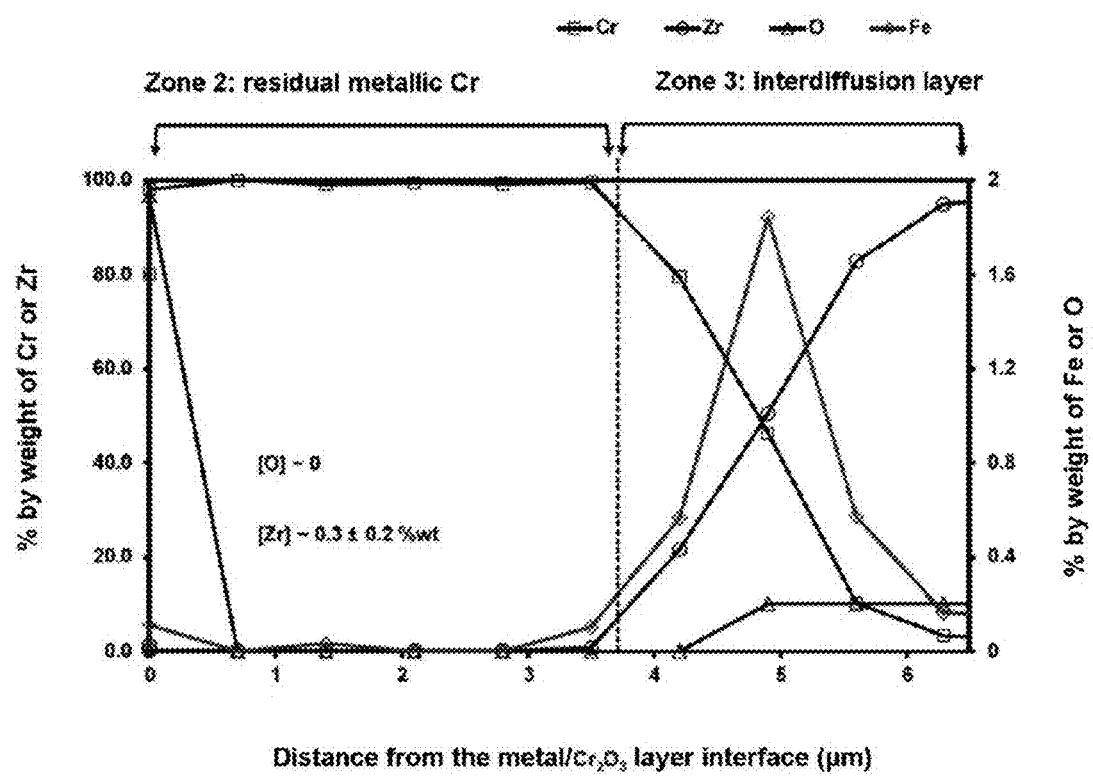

Such results are confirmed by FIGS. 3A and 3B, which illustrate the profiles of diffusion of the zirconium, chromium and oxygen measured with the electron microprobe in the thickness of the coating and in the vicinity of the Zircaloy-4/chromium interface.

The absence of measurable diffusion of oxygen within the residual metal layer of the HiPIMS coating and a fortiori in the zirconium-based internal layer may be observed.

For the control plate, the measurements of FIG. 3A show a significant diffusion of oxygen through the chromium coating, which exhibits a mean oxygen content of approximately 1% by weight. This diffusion continues actually within the Zircaloy-4, in which the oxygen content is of the order of 0.3% to 0.4% by weight in the first 100 μm from the chromium coating/Zircaloy-4 substrate interface.

For the plate produced in accordance with the manufacturing process of the invention, the measurements of FIG. 3B show that the mean oxygen content in the Zircaloy-4 is virtually identical to the initial value of 0.14% by weight. The absence of diffusion of oxygen within the residual chromium layer and a fortiori the Zircaloy-4 substrate makes it possible to preserve the mechanical properties of the substrate, among others the residual ductility and the residual toughness. This thus provides a much better margin of protection with regard to the harmful consequences of the oxidation at 1200° C.

Furthermore, similar experiments of an oxidation at 1200° C. for 300 seconds, followed by a quenching with water at ambient temperature, have confirmed such a behavior when the plate geometries are replaced by tubular cladding geometries nevertheless involving a different crystal texture: the gain in weight representative of the take up of oxygen is from 10 to 30 times less for the tube produced by the process of the invention in comparison with that measured for the tube covered with a chromium coating with a conventional cathode sputtering process.

2.2. Evaluation of the Resistance to Oxidation in Accident Conditions at 1300° C.

Another sample of the plate produced in accordance with the manufacturing process of the invention stays for 5600 seconds in an equimolar oxygen/helium atmosphere brought to 1300° C.

In this specific oxidation temperature domain, such an atmosphere composition is reasonably representative of the oxidation conditions under steam as, except for in a particular case (confined steam, alloy of mediocre quality, degraded surface condition, . . . ), no significant hydriding of the substrate occurs during the oxidation at 1300° C.

Figure 4:
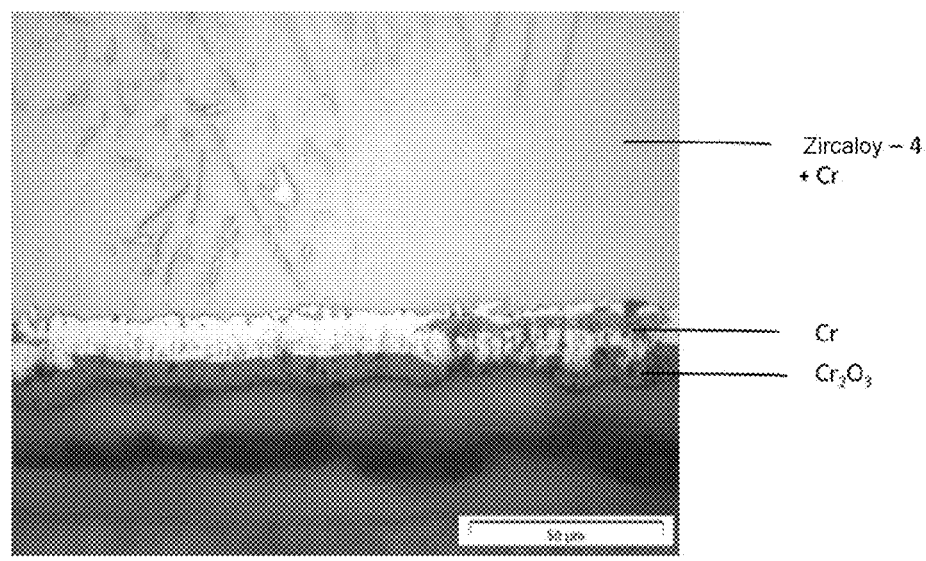
FIG. 4 represents an optical microscopy photograph of a cross section produced in the thickness of a plate similar to that of FIG. 1B after an oxidation at 1300° C.

Although these temperature conditions lie more than 100° C. above the "LOCA" regulatory limits, the photograph of FIG. 4 shows that the plate with a thickness of approximately 1 mm is not destroyed and that only a portion of the external chromium layer with an initial thickness of 15 μm to 20 μm has been oxidized to give chromic oxide $Cr_2O_3$.

The Zircaloy-4 substrate predominantly exhibits a structure of Zr-ex-β type which provides most of the residual ductility of the plate.

In comparison, the metallic residual internal layer of Zircaloy-4 of a control plate not coated with an external chromium layer and subjected to the same oxidation conditions for its part exhibits a wholly α-Zr(O) structure which is brittle at low temperature and which is responsible for a loss of integrity by transverse splitting.

Even in oxidizing conditions at 1300° C., far above regulatory safety limits, a nuclear fuel cladding obtained by the manufacturing process of the invention may retain its mechanical integrity and exhibit a comfortable residual margin of resistance to oxidation/hydriding.

2.3. Evaluation of the Resistance to Oxidation with an Interposed Tantalum Layer A plate is produced under conditions similar to those of example 1, apart from the fact that an interposed layer with a thickness of 2 μm to 3 μm approximately composed of tantalum is deposited on the internal layer using an HiPIMS sputtering process. The deposition of the interposed tantalum layer is carried out according to conditions similar to those of the deposition of the external chromium layer for example 1, apart from the fact that the tantalum target is polarized at −800 V for an impulse duration of 25 μs. After carrying out the ion etching (according to step a) of the manufacturing process of the invention) of the interposed tantalum layer, an external chromium layer with a thickness of 4 μm is subsequently deposited on this interposed layer in accordance with step b) of the manufacturing process of the invention.

By way of comparison, several corresponding control plates, apart from the fact that they are devoid of interposed tantalum layer, are produced.

After a residence of 300 seconds in a furnace in which steam at 1200° C. circulates, the profiles of diffusion of the chromium of the external layer toward the internal Zircaloy-4 layer are measured from the interface between these layers.

Figure 5:
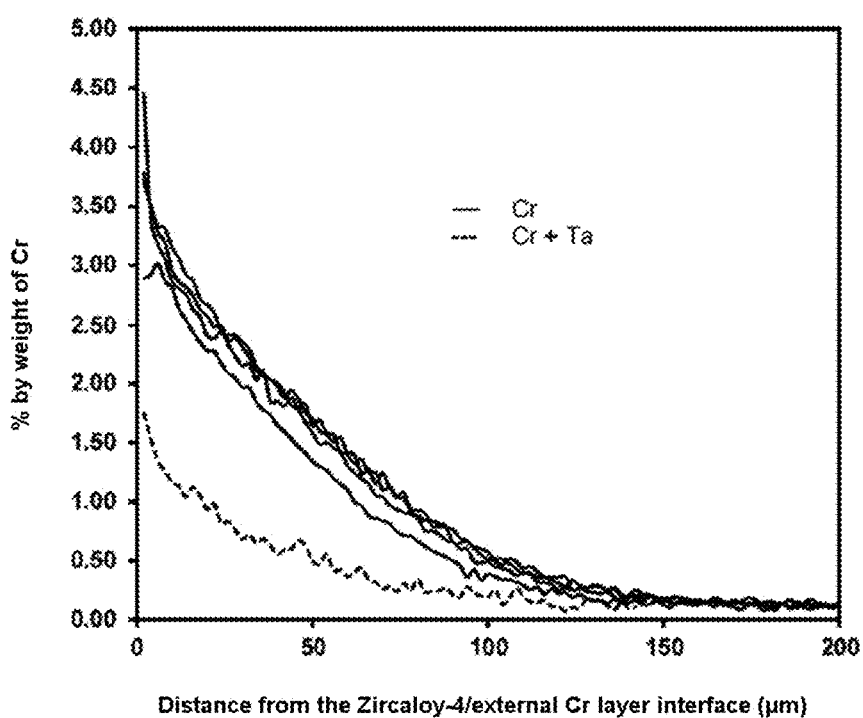
FIG. 5 illustrates the profile of concentration by weight of the chromium as a function of the distance in micrometers with respect to the Zircaloy-4/external chromium layer interface for plates similar to those obtained in FIG. 1B and provided (dotted curve denoted "Cr+Ta") or not provided (continuous curves denoted "Cr") with an interposed tantalum layer.

These measurements illustrated in FIG. 5 show:
  a very good reproducibility of the results obtained with regard to the control plates devoid of interposed tantalum layer;
  a diffusion of the chromium into the internal Zircaloy-4 layer which is greater for the control plates. This is because, at 1200° C., the external chromium layer is consumed at relatively similar proportion via an internal phenomenon of diffusion of the chromium toward the zirconium alloy and via the external oxidation of the chromium to give chromium oxide;

the beneficial effect in oxidizing conditions at 1200° C. of the interposed tantalum layer, which acts as a diffusion barrier: in comparison with the control plate, the total amount of chromium which diffuses from the external layer toward the internal Zircaloy-4 layer is thus divided by approximately 4 and the lifetime of the external layer may optionally be multiplied by 2.

Generally, the interposed layer reduces, indeed even eliminates, the phenomenon of diffusion, which increases the lifetime of the external layer and thus of the corresponding nuclear fuel cladding, amongst others in accident conditions, such as, for example, the dewatering of a spent fuel storage pool or those defined by the criteria of dimensioning accident of LOCA type.

Furthermore, the impact of the interposed layer on the diffusion of the chromium toward the zirconium alloy also has the advantage of delaying the formation of a eutectic between the zirconium and the chromium above 1330° C. and thus the production of a surface liquid phase, which makes it possible to avoid or limit the potentially negative consequences which might result therefrom in the event of an incursion above ~1320° C.

2.4. Evaluation of the Resistance to Hydriding at 1000° C.

Hydriding is a phenomenon which occurs within a nuclear fuel cladding in nominal conditions or in certain accident conditions. The hydriding results from the sequence of the following reactions (1) and (2): the zirconium present in the nuclear fuel cladding is oxidized by the pressurized water or the steam according to the reaction,

$$Zr+2H_2O \rightarrow ZrO_2+2H_2 \quad (1)$$

then a portion of the hydrogen thus released diffuses into the zirconium alloy of the cladding and may form a hydride with the zirconium of the cladding which has not yet oxidized, according to the reaction

$$Zr+xH \rightarrow ZrH_x. \quad (2)$$

The index "x" indicates that hydrides of variable stoichiometry may be formed, this index being in particular equal to or less than 2.

According to the overall hydrogen content and/or the temperature, all or a portion of the hydrogen will precipitate, the remainder remaining in solid solution (in insertion in the α-zirconium crystal lattice).

For example, at 20° C., virtually all of the hydrogen is precipitated in the form of hydrides, whereas their dissolution may be total at high temperature (typically greater than 600° C.)

Hydrogen in solid solution, but especially in the form of zirconium hydride precipitate, has the disadvantage of decreasing the ductility of zirconium alloys and thus of causing embrittlement of the cladding, among others at low temperature. This embrittlement is all the more to be feared when it is desired to reach high burn-up rates as, at these rates, an increase in the proportion of zirconium oxidized according to the reaction (1) and thus in the amount of hydrides formed according to reaction (2) is found. It then generally results in the corrosion of the usual industrial alloys at levels which are harmful with regard to the criteria of safety and integrity of the cladding, and may present problems for post-service transportation and storage.

Observed in normal conditions with regard to the zirconium alloys M5™ or Zirlo™ of a nuclear fuel cladding, hydriding is generally observed in accident conditions only in the vicinity of 1000° C., or toward 800° C. for longer oxidation times. This phenomenon, known as "breakaway", is associated with an increase in the kinetics of oxidation beyond a certain critical time. It results from the appearance of cracks and/or porosities in the $ZrO_2$ phase related to the presence of stresses generated at the $Zr/ZrO_2$ interface probably related to the reversible transformation of tetragonal $ZrO_2$ into monoclinic $ZrO_2$. The consequences of this uptake of hydrogen are, in the same way as in normal conditions, an embrittlement of the material in the vicinity of 1000° C. which can result in the fracturing thereof during a quenching or after returning to low temperature.

The "breakaway" phenomenon generally occurs after 5000 seconds at 1000° C. for a zirconium alloy, such as the Zircaloy-4 or M5™.

In order to evaluate the resistance to the hydriding of a nuclear fuel cladding according to the invention, another sample of the plate produced in accordance with the manufacturing process of the invention stays for 15 000 seconds in an atmosphere of steam brought to 1000° C.

By way of comparison, the same experiment is carried out with a control plate of Zircaloy-4 which has been covered with a chromium coating of the same thickness using a conventional cathode sputtering process in accordance with example 1 of "WO 2013/160587".

Figure 6A:
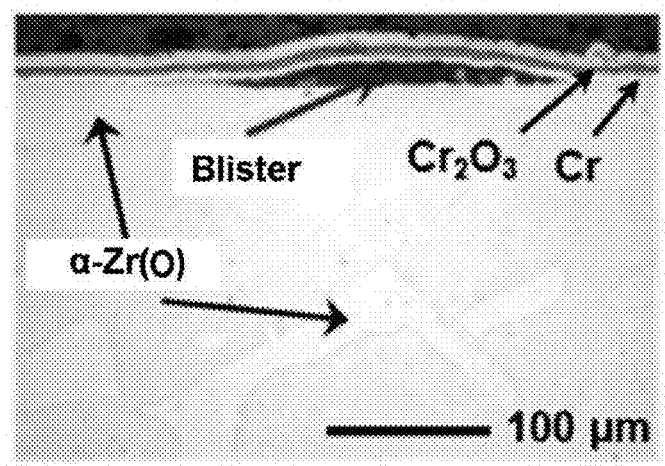
FIGS. 6A and 6B represent SEM photographs of a cross section produced in the thickness of the plates respectively illustrated in FIGS. 1A and 1B, after they have been subjected to an oxidation under steam at 1000° C. for 15 000 s.
Figure 6B:
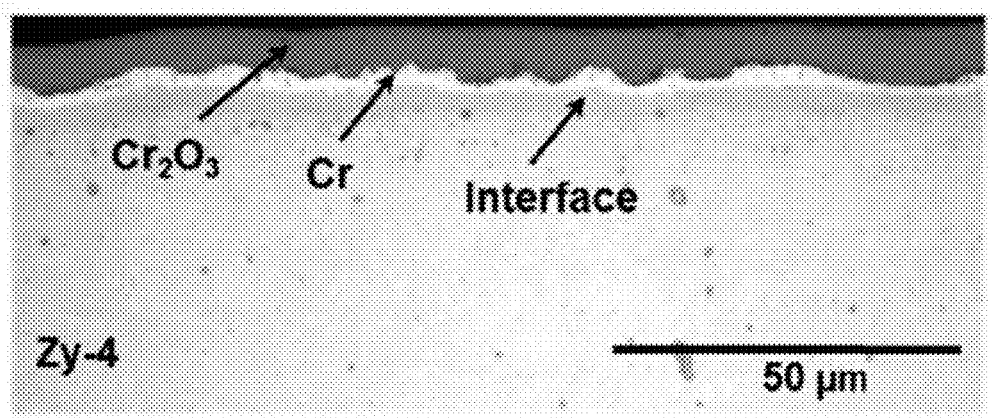

The results obtained are illustrated by FIGS. 6A and 6B.

FIG. 6A shows that the control plate exhibits a local exfoliation of the external chromium layer which has partly oxidized to give $Cr_2O_3$. The content of hydrogen dissolved in the plate is measured by analysis of the gases after reduction melting in an analyzer provided for this purpose, instead of the indirect and imprecise evaluation according to example 1 of the document "WO 2013/160587": this content is approximately 1000 ppm by weight. The Zircaloy-4 plate also comprises brittle phases of α-Zr(O) structure at low temperature due to the diffusion of oxygen into the Zircaloy-4. In point of fact, it is known that, after a quenching with water from the β domain (>900-1000° C.), Zircaloy-4 loses its residual ductility at low temperature (20-150° C.), when the hydrogen content increases in weight above 600 ppm approximately.

On the other hand, FIG. 6B shows that the plate produced in accordance with the manufacturing process of the invention exhibits a layer of oxide $Cr_2O_3$ with a thickness 5 times smaller than for the control plate. Furthermore, the content of dissolved hydrogen is at most from 60 ppm to 80 ppm by weight and no phase of α-Zr(O) structure appears in the zirconium-based substrate. The plate has a significant residual ductility since its mechanical strength is for its part approximately 900 MPa and the mode of fracture is transgranular ductile dimple with an elongation at break of several %. These results confirm the very good resistance to hydriding of a nuclear fuel cladding according to the invention, for example under "post-breakaway" conditions.

3. Geometry of the Nuclear Fuel Cladding According to the Invention

The nuclear fuel cladding obtained by the manufacturing process of the invention is described with reference to FIGS. 7A and 7B, in the nonlimiting specific case of a tubular geometry.

Figure 7A:
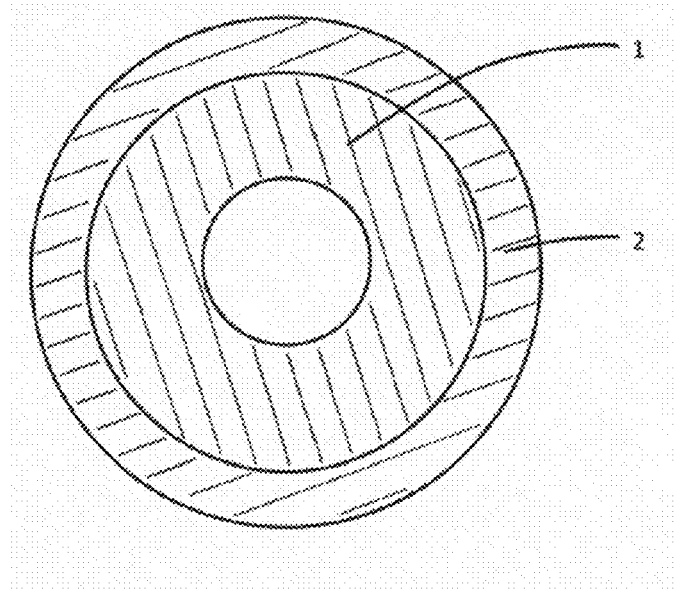
FIGS. 7A and 7B represent diagrammatic views in cross section of a nuclear fuel cladding of tubular shape, respectively deprived of and provided with an interposed layer.

According to a first embodiment of the invention, the cladding illustrated by FIG. 7A is composed of a zirconium-based internal layer (1), the internal surface of which delimits a closed volume capable of receiving the nuclear fuel. The internal layer (1) forms a substrate on which is placed an external layer (2) composed of a chromium-based protective material which makes it possible to improve the resistance to oxidation of the cladding at very high temperature.

Figure 7B:
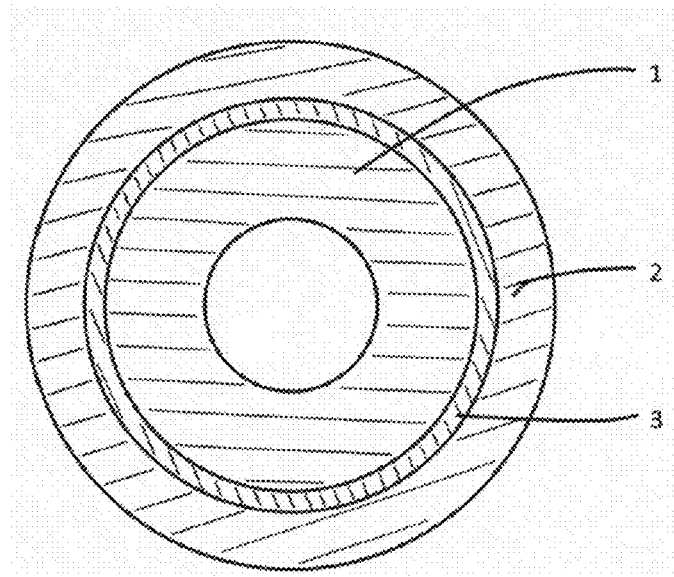

According to a second embodiment illustrated by FIG. 7B, the cladding may be provided with an interposed layer (3) placed between the internal layer (1) and the external layer (2). In this case, the combination of the internal layer (1) and of the interposed layer (3) forms the substrate. The interposed layer (3) is composed of at least one interposed material, such as, for example, tantalum, capable of preventing or limiting the diffusion of the chromium from the external layer (2) toward the internal layer (1).

According to a third nonillustrated embodiment, an internal coating is placed under the internal layer (1), and thus directly facing the volume capable of receiving the nuclear fuel.

It emerges from the preceding description that the process of the invention makes it possible to manufacture a nuclear fuel cladding exhibiting an improvement in the resistance to oxidation at very high temperature. The additional safety margins thus obtained make it possible among others to prevent or delay the deterioration in the cladding in the event of worsening or persistence of the accident situation.

The invention claimed is:

1. A process for the manufacture of a nuclear fuel cladding for a nuclear reactor, said fuel cladding comprising i) a substrate containing a zirconium-based internal layer coated or not coated with at least one interposed layer placed over said internal layer and ii) at least one external layer placed over the substrate and composed of a protective material chosen from chromium or a chromium-based alloy; the process comprising the following successive steps:
    a) providing a substrate containing a zirconium-based internal layer having an internal surface which delimits a closed volume for receiving the nuclear fuel and having an external surface opposite to said internal surface, said zirconium-based internal layer being coated or not coated with at least one interposed layer placed over said external face of the zirconium-based internal layer, said interposed layer having an internal face facing the external face of the zirconium-based internal layer, said interposed layer further comprising of at least one interposed material chosen from tantalum, molybdenum, tungsten, niobium, vanadium, hafnium or their alloys;
    b) ion etching of the external surface of the zirconium-based internal layer or, when present, of the external surface of the interposed layer; and
    c) deposition of said at least one external layer over the substrate and in contact with the external surface of the zirconium-based internal layer or, when present, with the external face of the interposed layer, said deposition being performed with a high power impulse magnetron sputtering (HiPIMS) process in which a magnetron cathode is composed of the protective material, said protective material being chosen from chromium or a chromium-based alloy,
    thereby producing a protected substrate suitable for use as a nuclear fuel cladding, wherein oxidation of the nuclear fuel cladding is inhibited on exposure of said cladding to a humid atmosphere at a temperature of 1200-1300° C. in the nuclear reactor.

2. A process for the manufacture of a nuclear fuel cladding according to claim 1, wherein the substrate provided in step (a) comprises an internal coating placed under said internal layer.

3. A process for the manufacture of a nuclear fuel cladding according to claim 1, wherein the zirconium-based internal layer is coated with at least one interposed layer placed over said internal layer.

4. A process for the manufacture of a nuclear fuel cladding according to claim 3, wherein said at least one interposed layer is placed over said internal layer by carrying out the following successive steps before the etching step a):
    a') ion etching of the surface of said internal layer; and
    b') production of a substrate by deposition of said at least one interposed layer over said internal layer with a high power impulse magnetron sputtering (HiPIMS) process in which the magnetron cathode is composed of the at least one interposed material.

5. A process for the manufacture of a nuclear fuel cladding according to claim 1, wherein deposition of said at least one external layer according to step (b) comprises depositing a first external layer with said HiPIMS sputtering process and depositing at least a part of an additional external layer or layers with a magnetron cathode sputtering process of a different type from the HiPIMS which is carried out simultaneously with said HiPIMS sputtering process.

6. The process according to claim 1, wherein each of said at least one external layer has a thickness of 1 µm to 50 µm.

7. The process according to claim 1, wherein each of said at least one external layer has a columnar structure.

8. The process according to claim 7, wherein constituent columnar grains of the columnar structure have a mean diameter of 100 nm to 10 µm.

* * * * *